United States Patent
Lee et al.

(10) Patent No.: US 11,315,849 B2
(45) Date of Patent: Apr. 26, 2022

(54) SEMICONDUCTOR PACKAGE HAVING STIFFENER

(71) Applicant: Samsung Electronics Co., Ltd., Suwon-si (KR)

(72) Inventors: Suchang Lee, Seoul (KR); Dongok Kwak, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/060,805

(22) Filed: Oct. 1, 2020

(65) Prior Publication Data
US 2021/0305117 A1    Sep. 30, 2021

(30) Foreign Application Priority Data
Mar. 27, 2020    (KR) .................. 10-2020-0037358

(51) Int. Cl.
*H01L 23/36* (2006.01)
*H01L 23/538* (2006.01)

(52) U.S. Cl.
CPC .......... *H01L 23/36* (2013.01); *H01L 23/5385* (2013.01); *H01L 23/5386* (2013.01)

(58) Field of Classification Search
CPC .. H01L 23/36; H01L 23/5385; H01L 23/5386
See application file for complete search history.

(56) References Cited

U.S. PATENT DOCUMENTS

| | | | |
|---|---|---|---|
| 2008/0042263 A1 | 2/2008 | Wang et al. | |
| 2008/0099898 A1* | 5/2008 | Cui | H01L 23/3677 257/678 |
| 2008/0308305 A1* | 12/2008 | Kawabe | H05K 1/0271 174/255 |
| 2009/0146315 A1* | 6/2009 | Shim | H05K 1/141 257/777 |
| 2019/0148260 A1* | 5/2019 | Sikka | H01L 23/562 257/713 |
| 2019/0311963 A1 | 10/2019 | Christianson et al. | |
| 2020/0411448 A1* | 12/2020 | Goh | H01L 23/562 |

FOREIGN PATENT DOCUMENTS

| | | |
|---|---|---|
| JP | 5306879B9 A | 7/2013 |
| JP | 2017130521 A | 7/2017 |
| KR | 100671748 B1 | 1/2007 |
| KR | 20180100603 A | 9/2018 |
| KR | 20190043902 A | 4/2019 |

OTHER PUBLICATIONS

Machine English Translation of JP2010238828, Asano Toshiya, published Oct. 21, 2010.*

* cited by examiner

*Primary Examiner* — Peniel M Gumedzoe
(74) *Attorney, Agent, or Firm* — Muir Patent Law, PLLC

(57) ABSTRACT

A semiconductor package includes a substrate including an upper surface and a side surface, an adhesive layer disposed on an edge of the upper surface of the substrate, and a stiffener including a horizontal portion disposed on the adhesive layer and extending in an horizontal direction to an outside of the substrate in a plan view and a vertical portion connected to the horizontal portion and extending vertically downwards from the horizontal portion. The vertical portion is spaced apart from the side surface of the substrate with a vertical gap extending in a vertical direction therebetween, and the outer width of the stiffener is 40 mm or more.

20 Claims, 8 Drawing Sheets

SEMICONDUCTOR PACKAGE HAVING STIFFENER

CROSS-REFERENCE TO THE RELATED APPLICATION

This application claims priority under 35 U.S.C. § 119 to Korean Patent Application No. 10-2020-0037358, filed on Mar. 27, 2020, in the Korean Intellectual Property Office, the disclosure of which is incorporated herein by reference in its entirety.

BACKGROUND

1. Field

The disclosure relates to a semiconductor package having a stiffener.

2. Description of the Related Art

With the trend of miniaturization of semiconductor devices, a plurality of semiconductor chips and various other devices may be mounted in a single package. Due to the difference in thermal expansion coefficient between various components in a semiconductor package, the semiconductor package may become warped. Therefore, there is a need for technology for controlling warpage of a semiconductor package.

SUMMARY

The example embodiments of the disclosure provide a semiconductor package having a stiffener.

A semiconductor package in accordance with an example embodiment of the disclosure may include a substrate including an upper surface and a side surface, an adhesive layer disposed on an edge of the upper surface of the substrate, and a stiffener including a horizontal portion disposed on the adhesive layer and extending in a horizontal direction to the outside of the substrate in a plan view and a vertical portion connected to the horizontal portion and extending vertically downwards from the horizontal portion. The vertical portion may be spaced apart from the side surface of the substrate with a vertical gap extending in a vertical direction therebetween, and the outer width of the stiffener may be 40 mm or more.

A semiconductor package in accordance with an example embodiment of the disclosure may include a substrate including an upper surface and a side surface, a first adhesive layer disposed on an edge of the upper surface of the substrate, a first stiffener disposed on the first adhesive layer, second stiffeners connected to the first stiffener, disposed outside the substrate in a plan view, and extending vertically, and second adhesive layers disposed between the first stiffener and the second stiffeners. A portion of each of the second stiffeners may be spaced apart from the side surface of the substrate with a vertical gap extending in a vertical direction therebetween, and the outer width of each of the second stiffeners may be 40 mm or more.

A semiconductor package in accordance with an example embodiment of the disclosure may include a substrate including an upper surface and a side surface, an adhesive layer disposed on opposite edges of the upper surface of the substrate, a stiffener including a horizontal portion disposed on the adhesive layer and extending in a horizontal direction to the outside of the substrate in a plan view and a vertical portion connected to the horizontal portion and extending vertically downwards from the horizontal portion, a heat spreader disposed on the stiffener, and a heat sink disposed on the heat spreader. The vertical portion may be spaced apart from the side surface of the substrate with a gap therebetween, and the outer width of the stiffener may be 40 mm or more.

BRIEF DESCRIPTION OF THE DRAWINGS

The above and other objects, features, and advantages of inventive concepts will become more apparent to those of ordinary skill in the art by describing example embodiments thereof in detail with reference to the accompanying drawings, in which.

DETAILED DESCRIPTION OF EXAMPLE EMBODIMENTS

Figure 1:
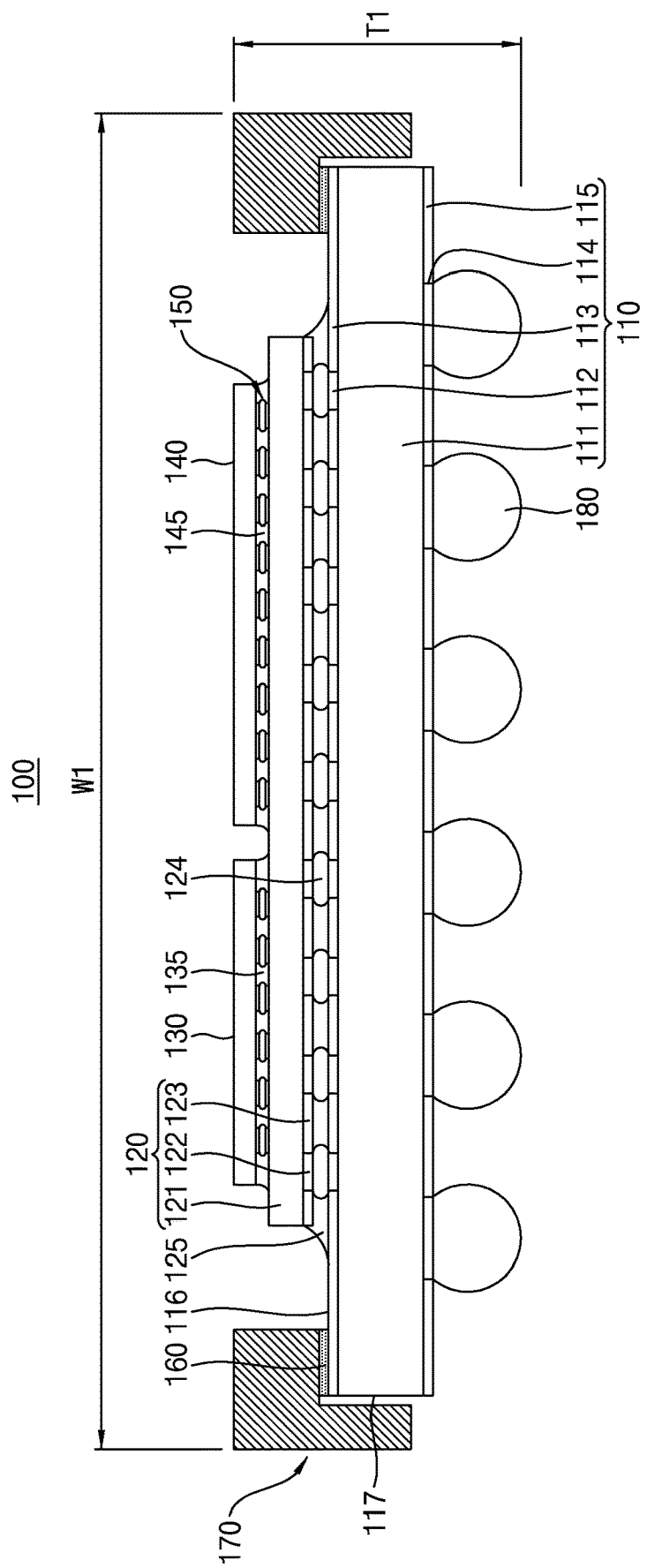
FIG. 1 is a vertical cross-sectional view of a semiconductor package according to an example embodiment of inventive concepts.
Figure 2:
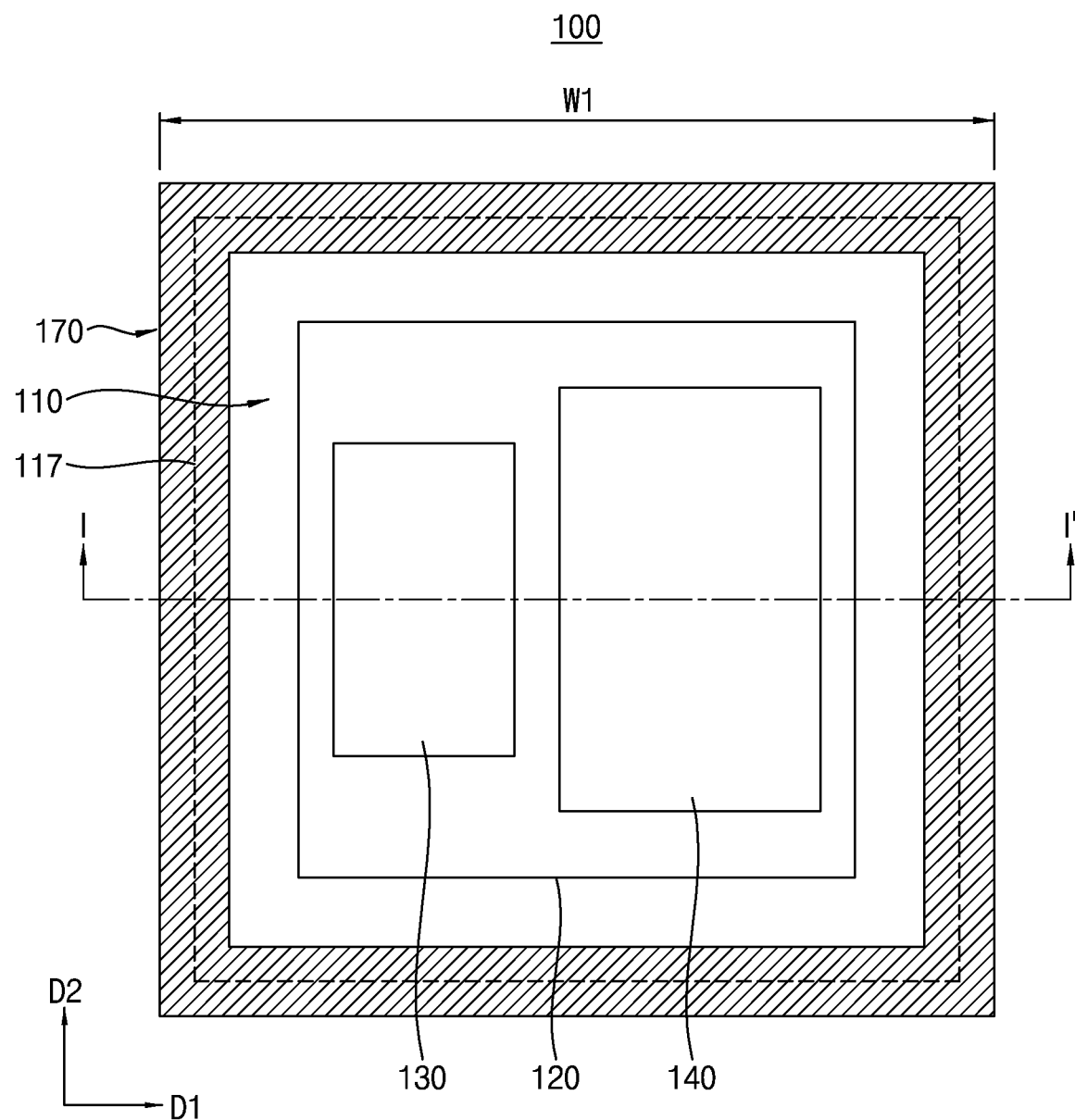
FIG. 2 is a plan view of the semiconductor package shown in FIG. 1.
Figure 3:
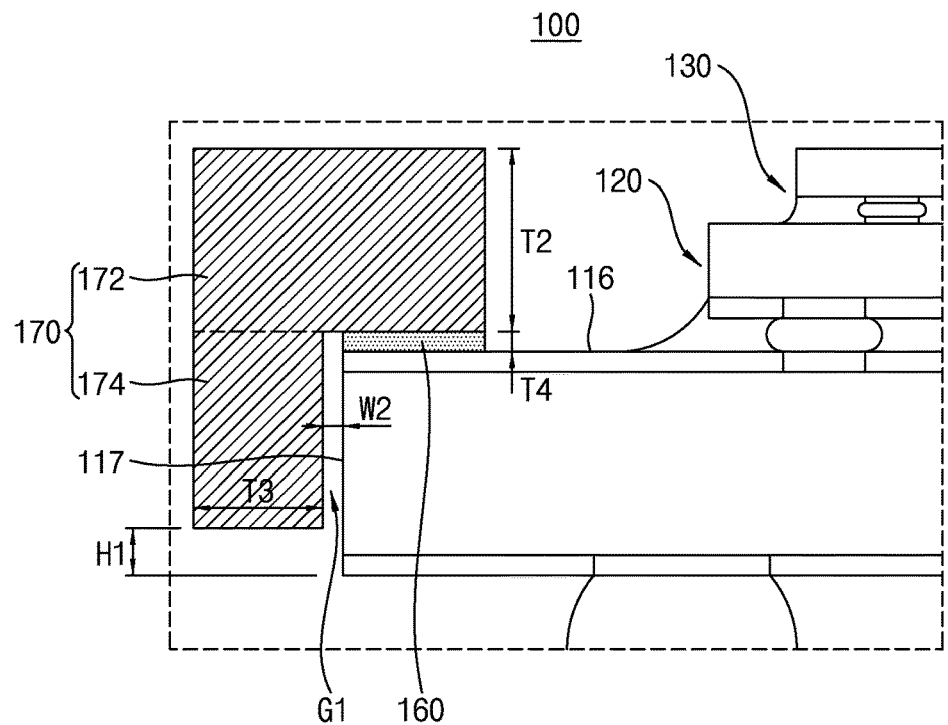
FIGS. 3-4 are enlarged views of portions of the semiconductor package shown in FIG. 1.
Figure 4:
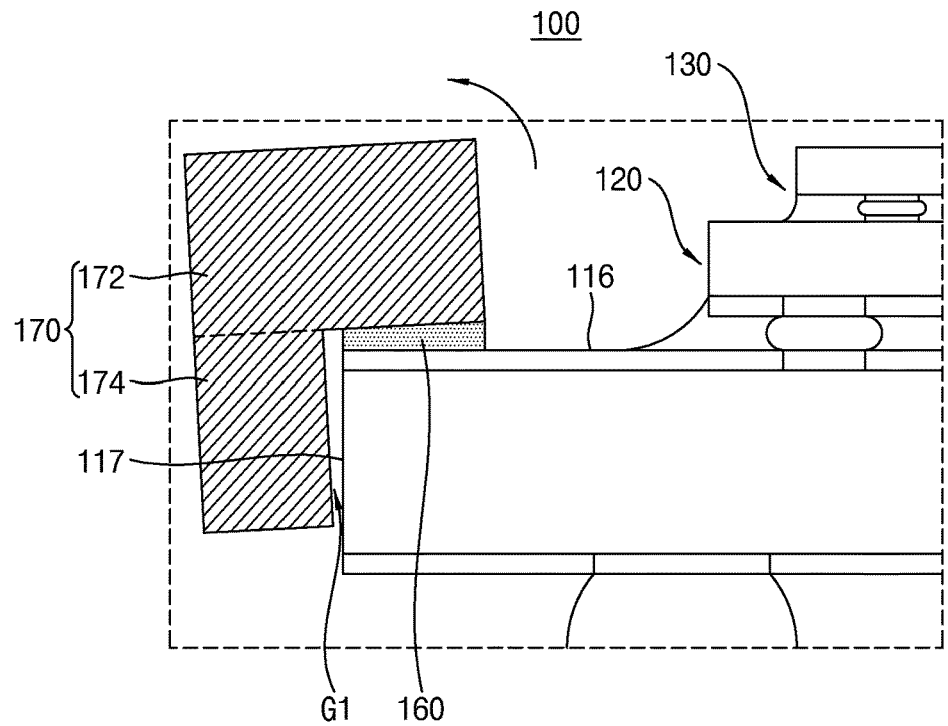

FIG. 1 is a vertical cross-sectional view of a semiconductor package according to an example embodiment of inventive concepts. FIG. 2 is a plan view of the semiconductor package shown in FIG. 1. FIGS. 3-4 are enlarged views of portions of the semiconductor package shown in FIG. 1.

Referring to FIGS. 1 to 3, a semiconductor package 100 may include a substrate 110, an interposer 120, a first connection member 124, a first semiconductor chip 130, a second semiconductor chip 140, a second connection member 150, an adhesive layer 160, a stiffener 170, and an external connection member 180.

The substrate 110 may include a base 111, an upper pad 112, an upper protective layer 113, a lower pad 114, a lower protective layer 115, an upper surface 116, and a side surface 117. The base 111 of the substrate 110 may include epoxy resin and/or glass fiber.

The upper pad 112 may be disposed on the upper surface 116 of the substrate 110, and may be electrically connected to the interposer 120. In certain embodiments, an upper surface of the upper pad 112 may correspond to the upper surface 116 of the substrate 110. The upper protective layer 113 may cover the upper surface of the base 111 and the side surface of the upper pad 112. The lower pad 114 may be disposed on the lower surface of the substrate 110, and the lower protective layer 115 may cover the lower surface of the base 111 and the side surface of the lower pad 114.

Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

The upper pad 112 and the lower pad 114 may include metal such as Al, Ti, Cr, Fe, Co, Ni, Cu, Zn, Pd, Pt, Au, and Ag. The upper protective layer 113 and the lower protective layer 115 may include a photosensitive solder resist film. The photosensitive solder resist may include a photosensitive polymer. The photosensitive polymer may include at least one of photosensitive polyimide (PSPI), polybenzoxazole (PBO), phenolic polymer, or benzocyclobutene-based polymer (BCB). For example, the photosensitive solder resist film may be a solder mask. For example, the photosensitive solder resist film may be formed of an insulator layer to protect circuitry from oxidation and/or to prevent external connection members 180 and/or first connection members 124 adjacent to each other from being connected to each other.

The interposer 120 may be disposed on the upper surface 116 of the substrate 110. The interposer 120 may include a base 121, a lower pad 122, and a lower protective layer 123. The lower pad 122 may be disposed on the lower surface of the base 121, and the lower protective layer 123 may cover the lower surface of the base 121 and the side surface of the lower pad 122. The first connection member 124 may be disposed between the substrate 110 and the interposer 120, and may electrically connect the substrate 110 to the interposer 120 through the upper pad 112 and the lower pad 122. An underfill 125 may cover the first connection member 124, and may fill the space between the substrate 110 and the interposer 120. For example, the semiconductor package 100 may include a plurality of first connection members 124 disposed between the substrate 110 and the interposer 120, and the underfill 125 may surround each of the plurality of the first connection members 124, e.g., in a plan view and by contacting a side wall of each first connection member 124. For example, the interposer 120 may be disposed between the substrate 110 and the semiconductor chips 130 and 140.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

The lower pad 122 and the lower protective layer 123 may include the same material as the lower pad 114 and the lower protective layer 115, respectively. For example, the lower pad 122 may include a metal and the lower protective layer 123 may include a photosensitive solder resist. The first connection member 124 may include at least one of tin or lead. The underfill 125 may include thermosetting resin or photocurable resin.

The first semiconductor chip 130 and the second semiconductor chip 140 may be disposed on the interposer 120.

The first semiconductor chip 130 and the second semiconductor chip 140 may be connected to the interposer 120 via the second connection member 150. An underfill 135 may cover the second connection member 150, and may fill the space between the first semiconductor chip 130 and the interposer 120. For example, the semiconductor package 100 may include a plurality of second connection members 150 disposed between the interposer 120 and the first semiconductor chip 130, and the underfill 135 may surround each of the plurality of the second connection members 150 disposed between the interposer 120 and the first semiconductor chip 130, e.g., in a plan view and by contacting a side wall of each second connection member 150. An underfill 145 may cover the second connection member 150, and may fill the space between the second semiconductor chip 140 and the interposer 120. For example, the semiconductor package 100 may include a plurality of second connection members 150 disposed between the interposer 120 and the second semiconductor chip 140, and the underfill 145 may surround each of the plurality of the second connection members 150 disposed between the interposer 120 and the second semiconductor chip 140, e.g., in a plan view and by contacting a side wall of each second connection member 150.

The first semiconductor chip 130 may include a memory chip such as DRAM, SRAM, PRAM, MRAM, or a flash memory. The second semiconductor chip 140 may include an application processor (AP) chip, such as a microprocessor or a microcontroller, or a logic chip, such as a CPU, a GPU, a modem, an application-specific IC (ASIC), or a field programmable gate array (FPGA).

The adhesive layer 160 may be disposed on the upper surface 116 of the substrate 110. In an example embodiment, the adhesive layer 160 may be disposed along the edge of the substrate 110 in a plan view. The outer side surface of the adhesive layer 160 may be aligned with the side surface 117 of the substrate 110 in the vertical direction. The adhesive layer 160 may fix the stiffener 170 onto the substrate 110. The adhesive layer 160 may include a thermal interface material (TIM) including polymer, resin, or epoxy and a filler. For example, the thermal interface material may have a high thermal conductivity and may transfer heat well. The filler may include a dielectric filler such as aluminum oxide, magnesium oxide, aluminum nitride, boron nitride, or diamond powder. Alternatively, the filler may be a metal filler such as silver, copper, or aluminum.

The stiffener 170 may be disposed on the adhesive layer 160. When viewed in a plan view, the stiffener 170 may be disposed along the edge of the substrate 110, and may have a frame shape. The outer side surface of the stiffener 170 may be located further outwards than the side surface 117 of the substrate 110. For example, the outer side surface of the stiffener 170 may surround the side surface 117 of the substrate 110, e.g., in a plan view. The stiffener 170 may prevent or reduce the warpage of the substrate 110 in the package-forming process. For example, the stiffener 170 may have a role protecting the substrate 110 and/or protecting the semiconductor package 100 from being damaged/warped.

The external connection member 180 may be disposed on the lower surface of the substrate 110. The external connection member 180 may be electrically connected to the first connection member 124 and/or the second connection member 150 via the substrate 110. The external connection member 180 may be an external connection terminal configured to be connected to an external circuit.

In an example embodiment, the total thickness T1 of the semiconductor package 100 may be 2 mm or more. For example, the height from the lower end of the external connection member 180 to the upper surface of the stiffener 170 may be 2 mm or more. In an example embodiment, the horizontal width W1 of the semiconductor package 100 may be 40 mm or more. For example, the outer width (e.g., from one outer end to an opposite outer end) of the stiffener 170 in a first direction D1 may be 40 mm or more. In an example embodiment, the outer width of the stiffener 170 in a second direction D2 may be 40 mm or more. For example, the semiconductor package 100 may have square shape in a plan view. For example, the outer width of the stiffener 170 may be a horizontal width from an outer end of the stiffener 170 formed on one edge of the substrate 110 to an outer end of the stiffener formed on an opposite edge of the substrate 110. For example, the first and second directions D1 and D2 may be parallel to sides of the substrate 110 respectively. For example, the first and second directions D1 and D2 may be perpendicular to each other. For example, the first and second directions D1 and D2 may be parallel to the upper surface 116 of the substrate 110.

Referring to FIG. 3, the stiffener 170 may include a horizontal portion 172 and a vertical portion 174. For example, the horizontal portion 172 of the stiffener 170 may be a portion of the stiffener 170 disposed at a higher level than the adhesive layer 160. For example, the horizontal portion 172 may have a width in the first direction D1 or in the second direction D2 greater than a vertical thickness T2 of the horizontal portion 172. For example, the vertical portion 174 of the stiffener 170 may be a portion of the stiffener 170 disposed at the same level as or a lower level than the adhesive layer 160. A portion of the horizontal portion 172 may overlap the upper surface 116 of the substrate 110 and the adhesive layer 160 in the vertical direction. The horizontal portion 172 may extend to the outside of the substrate 110.

The vertical portion 174 may be connected to the horizontal portion 172, and may extend vertically downwards from the horizontal portion 172. For example, the vertical portion 174 may have a height greater than its horizontal thickness T3 in the first direction D1 or the second direction D2. For example, the vertical portion 174 may be connected to the lower surface of the portion of the horizontal portion 172 that extends to the outside of the substrate 110 in a plan view. In example embodiments, the vertical portion 174 may be integrally formed with the horizontal portion 172, and the outer side surface of the vertical portion 174 may be coplanar with the outer side surface of the horizontal portion 172. The vertical portion 174 may overlap the substrate 110 in the horizontal direction, and may not be in contact with the side surface 117 of the substrate 110. For example, the vertical portion 174 may be spaced apart from the side surface 117 of the substrate 110 with a vertical gap G1 therebetween. The vertical gap G1 may be defined by the lower surface of the horizontal portion 172, the inner side surface of the vertical portion 174, and the side surface 117 of the substrate 110.

In an example embodiment, the vertical thickness T2 of the horizontal portion 172 may be 0.5 mm to 2 mm. The horizontal thickness T3 of the vertical portion 174 may be 0.5 mm to 2 mm. The thickness T4 of the adhesive layer 160 may be 0.05 mm to 0.2 mm. The horizontal width W2 of the vertical gap G1 may be 0.05 mm to 0.2 mm. The lower surface of the vertical portion 174 may be located at a higher level than the lower surface of the substrate 110. For example, the height difference H1 between the lower surface of the vertical portion 174 and the lower surface of the substrate 110 may be 1 mm or less. However, the disclosure is not limited thereto.

In an example embodiment, the stiffener 170 may include metal such as Cu. In an example embodiment, the stiffener 170 may include the same material as the substrate 110, for example glass fiber.

As shown in FIG. 3, the stiffener 170 extends so as to cover the side surface 117 of the substrate 110 as well as the upper surface 116 of the substrate 110, thereby controlling/preventing the warpage of the substrate 110.

FIG. 4 shows the situation in which the stiffener 170 is bent relative to the substrate 110. For example, even when the stiffener 170 is bent, it may not come into direct contact with the side surface 117 of the substrate 110, and thus the substrate 110 may not be affected by the bending of the stiffener 170. As shown in FIG. 4, in the process of forming the semiconductor package 100, the stiffener 170 itself may be expanded or contracted by heat and may consequently be deformed. Since the vertical portion 174 of the stiffener 170 is spaced apart from the side surface 117 of the substrate 110 with the vertical gap G1 therebetween, it may prevent or reduce warpage of the substrate 110 attributable to deformation of the stiffener 170. For example, even though the stiffener 170 is deformed in some degree as shown in FIG. 4, the substrate 110 may not be warped/deformed.

Figure 5:
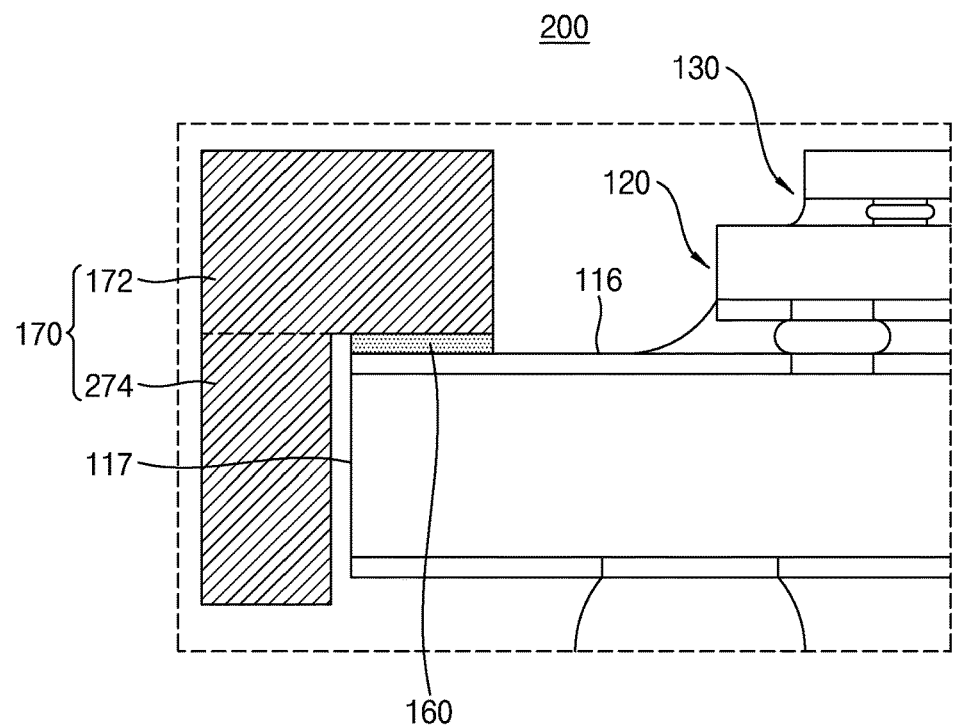
FIG. 5-6 are cross-sectional views of semiconductor packages according to example embodiments of inventive concepts.
Figure 6:
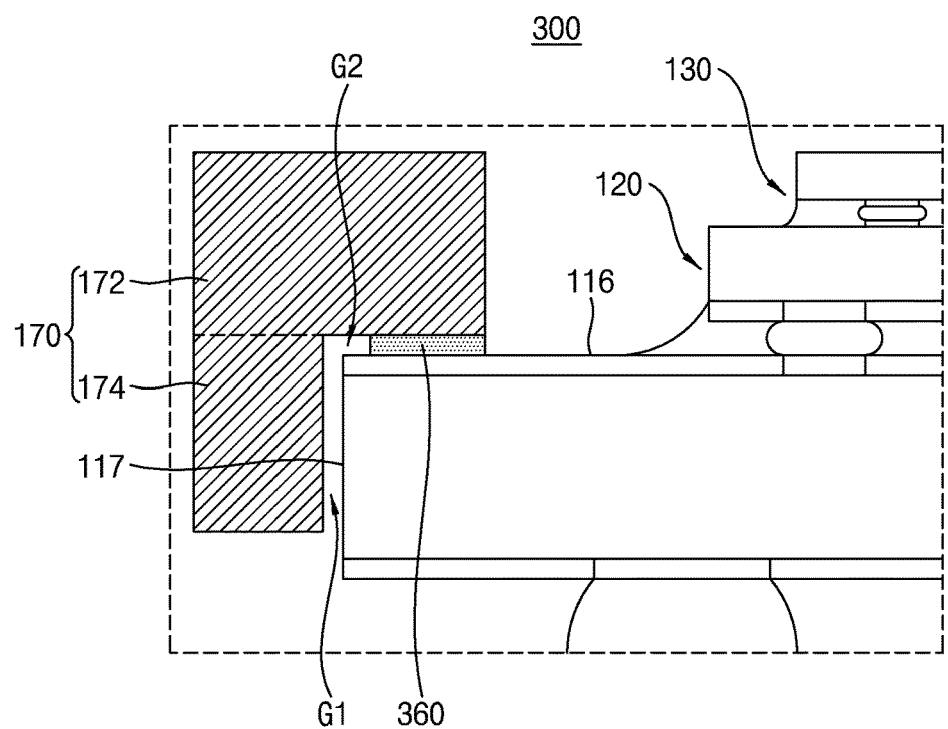

FIG. 5-6 are cross-sectional views of semiconductor packages according to example embodiments of inventive concepts.

Referring to FIG. 5, a semiconductor package 200 may include a stiffener 170, which is bonded to an upper surface 116 of a substrate 110. The stiffener 170 may include a horizontal portion 172 and a vertical portion 274. The vertical portion 274 may extend further downwards than the substrate 110. For example, the lower surface of the vertical portion 274 may be located at a lower level than the lower surface of the substrate 110. In an example embodiment, the height difference H2 between the lower surface of the vertical portion 274 and the lower surface of the substrate 110 may be 1 mm or less. For example, the heights may be levels of vertical distances from a plane parallel to the upper surface 116 of the substrate 110.

Referring to FIG. 6, a semiconductor package 300 may include an adhesive layer 360 disposed between an upper surface 116 of a substrate 110 and a stiffener 170. In an example embodiment, the outer side surface of the adhesive layer 360 may be located further inwards than the side surface 117 of the substrate 110, e.g., in a plan view. For example, "inwards" may refer to directions toward the center of the package 100 in a plan view, and "outwards" may refer to directions opposite to inwards. These directional concept may also be applied to "inner" and "outer" in the present disclosure. For example, a portion of the horizontal portion 172 may be spaced apart from a portion of the upper surface 116 of the substrate 110 with a horizontal gap G2 therebetween. The horizontal gap G2 may be defined by the lower surface of the horizontal portion 172 and the upper surface 116 of the substrate 110. The horizontal gap G2 may extend from the upper end of the vertical gap G1 in the horizontal direction.

Figure 7:
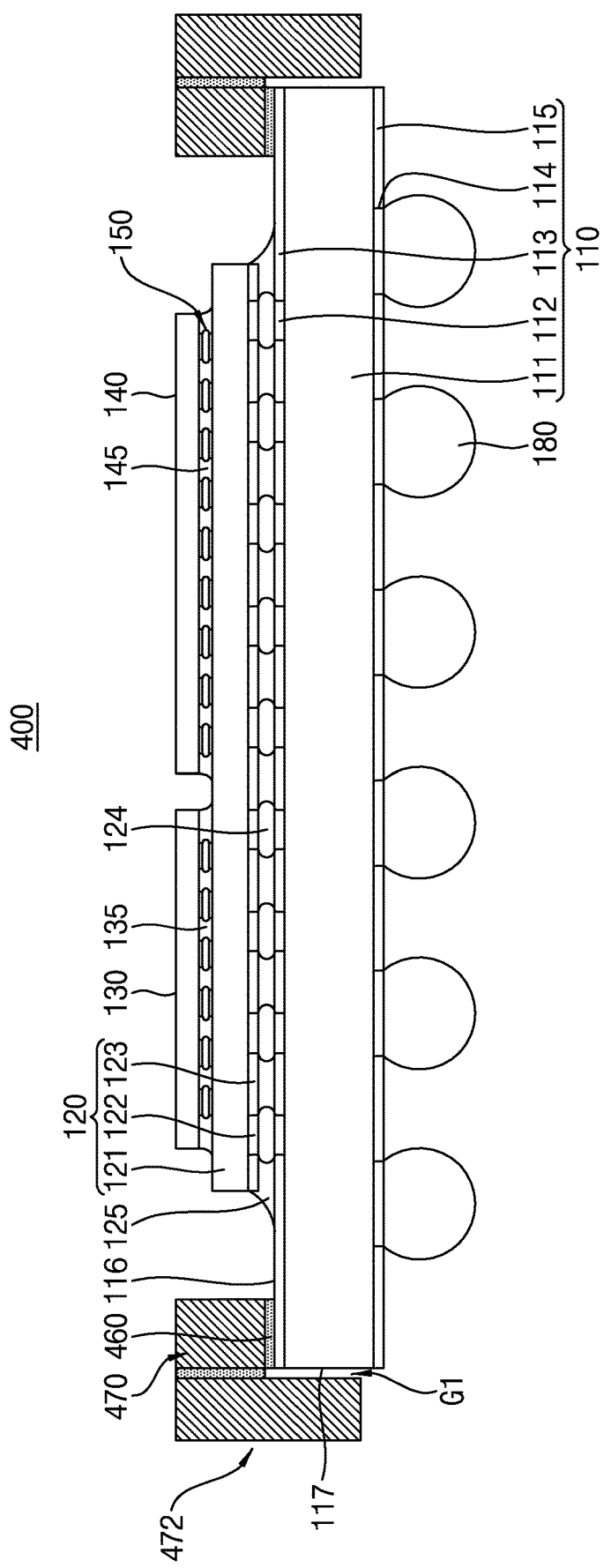
FIG. 7 is a vertical cross-sectional view of the semiconductor package according to an example embodiment of inventive concepts.
Figure 8:
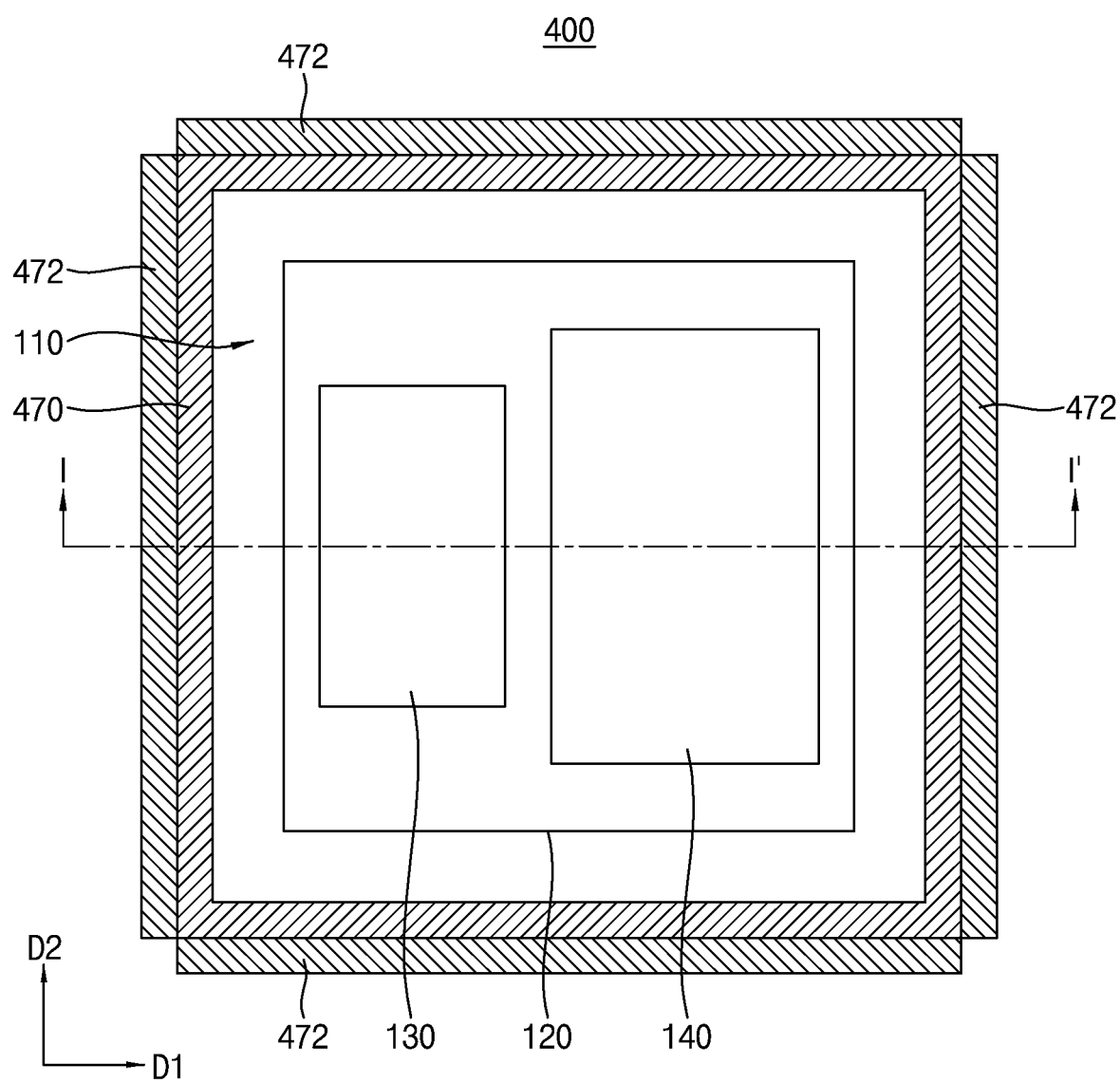
FIG. 8 is a plan view of the semiconductor package shown in FIG. 7.
Figure 9:
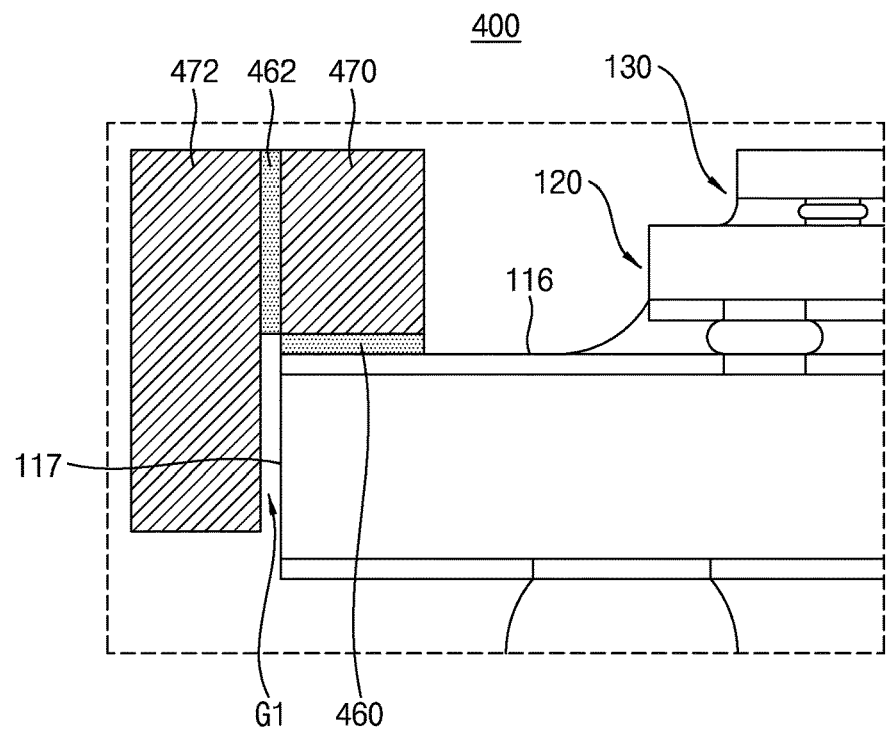
FIG. 9 is an enlarged view of a portion of the semiconductor package shown in FIG. 7.

FIG. 7 is a vertical cross-sectional view of the semiconductor package according to an example embodiment of inventive concepts. FIG. 8 is a plan view of the semiconductor package shown in FIG. 7. FIG. 9 is an enlarged view of a portion of the semiconductor package shown in FIG. 7.

Referring to FIGS. 7 and 8, a semiconductor package 400 may include a first stiffener 470, which is bonded to an upper surface 116 of a substrate 110, and a second stiffener 472. The first stiffener 470 may be disposed on a first adhesive layer 460. When viewed in a plan view, the first stiffener 470 may be disposed along the edge of the substrate 110. The outer side surface of the first stiffener 470 may be coplanar with the side surface 117 of the substrate 110. However, the disclosure is not limited thereto. The second stiffener 472 may be bonded to the outer side surface of the first stiffener 470. The second stiffener 472 may be partially disposed outside the first stiffener 470. For example, when viewed in a plan view, each second stiffener 472 may be disposed on a respective one of the sides of the substrate 110. In an example embodiment, each second stiffener 472 of a plurality of second stiffeners 472 may be disposed on a corresponding one of the sides of the substrate 110.

Referring to FIG. 9, a second adhesive layer 462 may be disposed between the first stiffener 470 and the second stiffener 472. The second stiffener 472 may extend vertically downwards, e.g., from a level the same as a top surface of the first stiffener 470, and may overlap the substrate 110 in the horizontal direction. For example, the second stiffener 472 may be spaced apart from the side surface 117 of the substrate 110 with a vertical gap G1 therebetween. The upper surface/boundary of the vertical gap G1 may be defined by the lower surface of the first stiffener 470 and/or by a lower surface of the second adhesive layer 462, and the side surfaces/boundaries of the vertical gap G1 may be defined by the inner side surface of the second stiffener 472 and the side surface 117 of the substrate 110.

Figure 10:
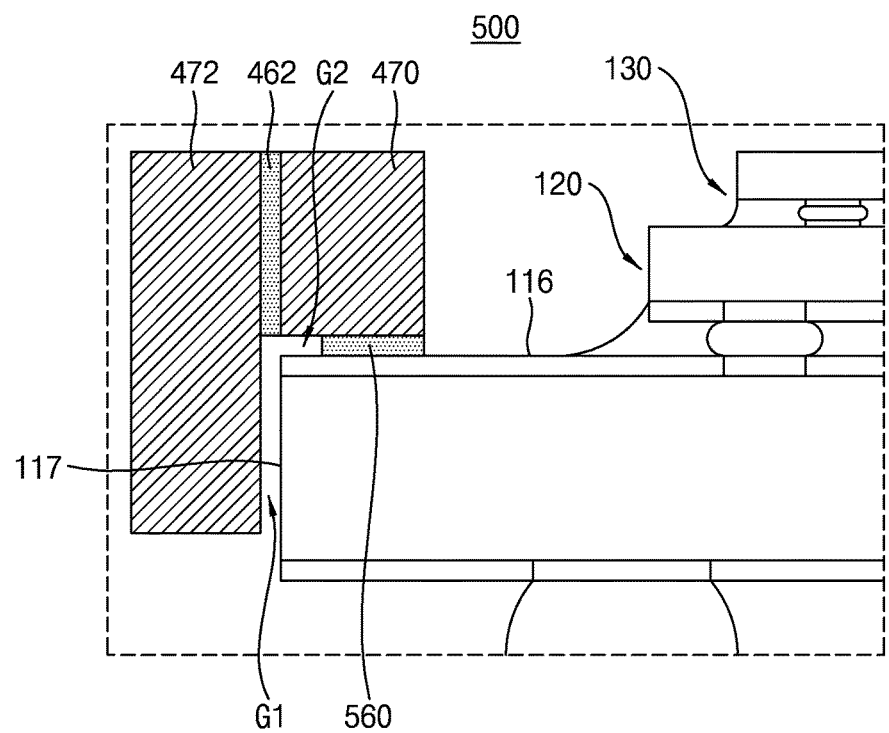
FIG. 10 is a cross-sectional view of a semiconductor package according to an example embodiment of inventive concepts.

FIG. 10 is a cross-sectional view of a semiconductor package according to an example embodiment of inventive concepts.

Referring to FIG. 10, a semiconductor package 500 may include an adhesive layer 560 disposed between an upper surface 116 of a substrate 110 and a first stiffener 470. In an example embodiment, the outer side surface of the adhesive layer 560 may be located further inwards than the side surface 117 of the substrate 110, e.g., in a plan view. For example, the first stiffener 470 may be spaced apart from the upper surface 116 of the substrate 110 with a horizontal gap G2 therebetween. The upper surface/boundary of the horizontal gap G2 may be defined by the lower surface of the first stiffener 470, and the lower surface/boundary of the horizontal gap G2 may be defined by the upper surface 116 of the substrate 110. The horizontal gap G2 may extend from the upper end of the vertical gap G1 in the horizontal direction. For example, an outer end of the horizontal gap G2 and the upper end of the vertical gap G1 may be connected to form a bent gap between the substrate 110 and the stiffeners 470 and 472 in a cross-sectional view.

Figure 11:
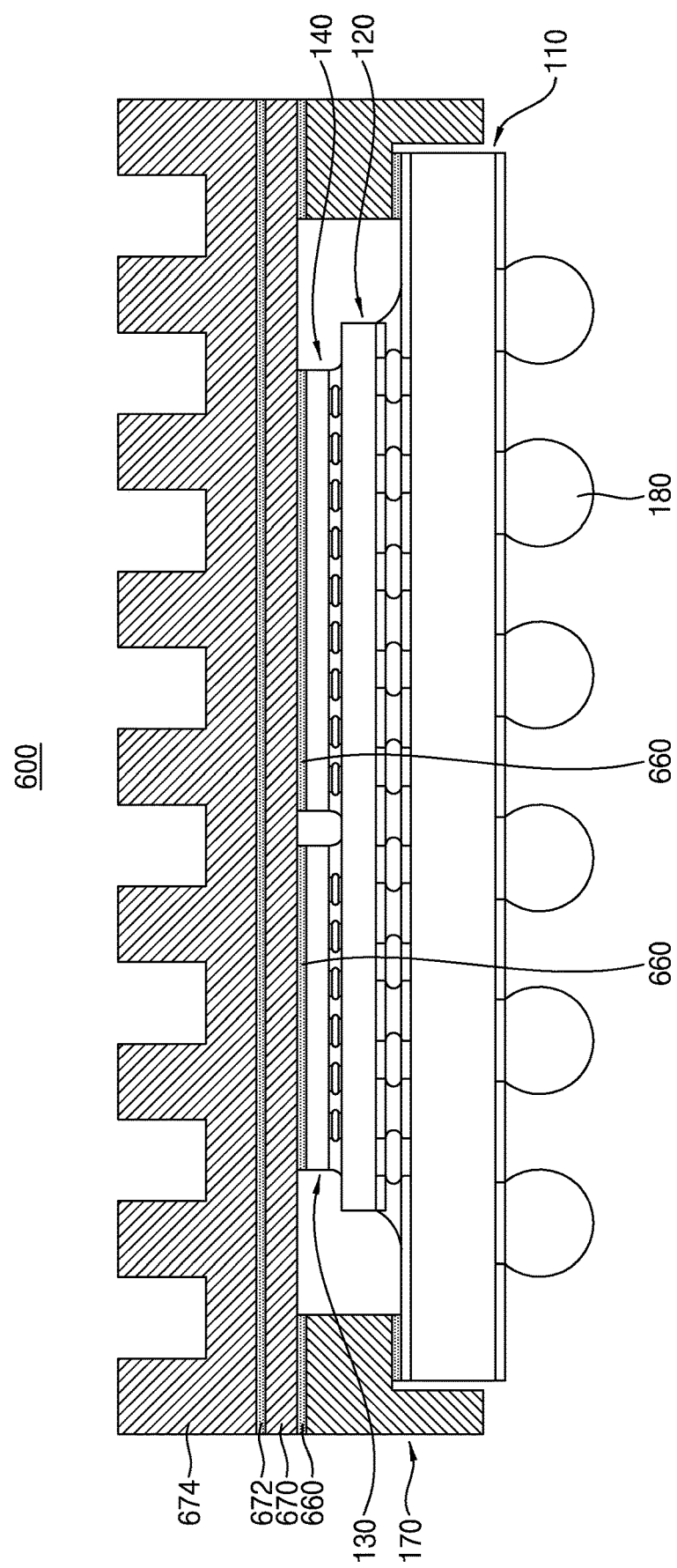
FIG. 11 is a vertical cross-sectional view of a semiconductor package according to an example embodiment of inventive concepts.

FIG. 11 is a vertical cross-sectional view of a semiconductor package according to an example embodiment of inventive concepts.

Referring to FIG. 11, a semiconductor package 600 may include a stiffener 170, a first heat transfer material layer 660, a heat spreader 670, a second heat transfer material layer 672, and a heat sink 674.

The first heat transfer material layer 660 may be disposed on the stiffener 170, a first semiconductor chip 130, and a second semiconductor chip 140. The outer side surface of the heat spreader 670 may be disposed further outwards than the side surface 117 of the substrate 110, e.g. in a plan view. The first heat transfer material layer 660 may transfer heat from the stiffener 170, the first semiconductor chip 130 and the second semiconductor chip 140 to the heat spreader 670. The heat spreader 670 may include a material having high thermal conductivity. For example, the heat spreader 670 may include Ag, Cu, Ni, Au, or combinations thereof. The second heat transfer material layer 672 may be disposed on the heat spreader 670, and the heat sink 674 may be disposed on the second heat transfer material layer 672. The second heat transfer material layer 672 may transfer heat from the heat spreader 670 to the heat sink 674. The first heat transfer material layer 660 and the second heat transfer material layer 672 may include the same material as the adhesive layer 160. The heat sink 674 may dissipate heat in the semiconductor package 600 to the outside. The heat sink 674 may include a metal-based material, a ceramic-based material, a carbon-based material, or a polymer-based material.

As is apparent from the above description, according to the example embodiments of the disclosure, a semiconductor package includes a stiffener covering the side surface of a substrate. As a result, the stiffener may be beneficial to prevent or reduce warpage of the semiconductor package.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for the purposes of limitation.

What is claimed is:

1. A semiconductor package comprising:
   a substrate including an upper surface and a side surface;
   an adhesive layer disposed on an edge of the upper surface of the substrate; and
   a stiffener including a horizontal portion disposed on the adhesive layer and extending in a horizontal direction to an outside of the substrate in a plan view and a vertical portion connected to the horizontal portion and extending vertically downwards from the horizontal portion,
   wherein a portion of the horizontal portion of the stiffener is spaced apart from the upper surface of the substrate with a first empty gap extending in a horizontal direction therebetween and the vertical portion of the stiffener is spaced apart from the side surface of the substrate with a second empty gap extending in a vertical direction therebetween, and
   wherein a distance between the adhesive layer and the vertical portion of the stiffener is larger than a distance between the side surface of the substrate and the vertical portion of the stiffener.

2. The semiconductor package of claim 1, wherein a total thickness of the semiconductor package in the vertical direction is 2 mm or more.

3. The semiconductor package of claim 1, wherein a thickness of the adhesive layer in the vertical direction is 0.05 mm to 0.2 mm.

4. The semiconductor package of claim 1, wherein a vertical thickness of the horizontal portion is 0.5 mm to 2 mm.

5. The semiconductor package of claim 1, wherein a horizontal thickness of the vertical portion is 0.5 mm to 2 mm.

6. The semiconductor package of claim 1, wherein a height difference between a lower surface of the vertical portion and a lower surface of the substrate is 1 mm or less.

7. The semiconductor package of claim 1, wherein a horizontal width of the second empty gap is 0.05 mm to 0.2 mm.

8. The semiconductor package of claim 1, wherein the second empty gap is defined by a lower surface of the horizontal portion, an inner side surface of the vertical portion, and the side surface of the substrate.

9. The semiconductor package of claim 1, wherein a side surface of the adhesive layer is not aligned with the side surface of the substrate.

10. The semiconductor package of claim 1, wherein a lower surface of the vertical portion is located at a lower level than a lower surface of the substrate.

11. The semiconductor package of claim 1, wherein a side surface of the adhesive layer is spaced apart from an inner side surface of the vertical portion of the stiffener.

12. The semiconductor package of claim 1, wherein the stiffener is disposed along an edge of the substrate.

13. The semiconductor package of claim 1, further comprising:
an external connection terminal disposed on a lower surface of the substrate;
an interposer disposed on the substrate; and
a semiconductor chip disposed on the interposer.

14. A semiconductor package comprising:
a substrate including an upper surface and a side surface;
a first adhesive layer disposed on an edge of the upper surface of the substrate;
a first stiffener disposed on the first adhesive layer;
second stiffeners connected to the first stiffener, the second stiffeners being disposed outside the substrate in a plan view and extending vertically; and
second adhesive layers disposed between the first stiffener and the second stiffeners,
wherein a portion of each of the second stiffeners is spaced apart from the side surface of the substrate with a vertical gap extending in a vertical direction therebetween, and
wherein an outer width of each of the second stiffeners is 40 mm or more.

15. The semiconductor package of claim 14, wherein the first stiffener is formed along an edge of the substrate.

16. The semiconductor package of claim 15, wherein the second stiffeners are respectively disposed on four side surfaces of the first stiffener.

17. The semiconductor package of claim 14, wherein a side surface of the first adhesive layer is located further inwards than the side surface of the substrate in a plan view, wherein a portion of the first stiffener is spaced apart from the upper surface of the substrate with a horizontal gap extending in a horizontal direction therebetween, and wherein the horizontal gap is defined by a lower surface of the first stiffener and the upper surface of the substrate.

18. A semiconductor package comprising:
a substrate including an upper surface and a side surface;
an adhesive layer disposed on opposite edges of the upper surface of the substrate;
a stiffener including a horizontal portion disposed on the adhesive layer and extending in a horizontal direction to an outside of the substrate in a plan view and a vertical portion connected to the horizontal portion and extending vertically downwards from the horizontal portion;
a heat spreader disposed on the stiffener; and
a heat sink disposed on the heat spreader,
wherein a portion of the horizontal portion of the stiffener is spaced apart from the upper surface of the substrate with a first empty gap therebetween and the vertical portion of the stiffener is spaced apart from the side surface of the substrate with a second empty gap therebetween, and
wherein a distance between the adhesive layer and the vertical portion of the stiffener is larger than a distance between the side surface of the substrate and the vertical portion of the stiffener.

19. The semiconductor package of claim 18, further comprising:
an external connection terminal disposed on a lower surface of the substrate;
an interposer disposed on the substrate; and
a semiconductor chip disposed on the interposer,
wherein the heat spreader is connected to the semiconductor chip.

20. The semiconductor package of claim 18, wherein a side surface of the heat spreader is located further outwards than the side surface of the substrate in a plan view.

* * * * *